(12) United States Patent
Man

(10) Patent No.: US 12,591,060 B2
(45) Date of Patent: Mar. 31, 2026

(54) COLOR DEPTH INTEGRATION METHOD, RECEIVER, AND LIGHT DETECTION AND RANGING APPARATUS THEREOF

(71) Applicant: Compertum Microsystems Inc., Hsinchu City (TW)

(72) Inventor: Francis Piu Man, Hsinchu City (TW)

(73) Assignee: Compertum Microsystems Inc., Hsinchu City (TW)

( * ) Notice: Subject to any disclaimer, the term of this patent is extended or adjusted under 35 U.S.C. 154(b) by 274 days.

(21) Appl. No.: 18/372,146

(22) Filed: Sep. 25, 2023

(65) Prior Publication Data

US 2025/0102671 A1     Mar. 27, 2025

(51) Int. Cl.
*G01S 17/86* (2020.01)
*G01S 17/931* (2020.01)
*G06T 7/521* (2017.01)
*H10F 30/225* (2025.01)

(52) U.S. Cl.
CPC ............ *G01S 17/86* (2020.01); *G01S 17/931* (2020.01); *G06T 7/521* (2017.01); *H10F 30/225* (2025.01); *G06T 2207/10024* (2013.01); *G06T 2207/10028* (2013.01)

(58) Field of Classification Search
CPC ....... G01S 17/86; G01S 17/931; G06T 7/521; G06T 2207/10024; G06T 2207/10028; H10F 30/225
See application file for complete search history.

(56) References Cited

U.S. PATENT DOCUMENTS

| | | | | | |
|---|---|---|---|---|---|
| 11,470,284 | B2 * | 10/2022 | Droz | ........................ | G01S 17/86 |
| 11,624,835 | B2 * | 4/2023 | Pacala | ........................ | G06T 7/55 |
| | | | | | 356/5.01 |
| 12,204,033 | B2 * | 1/2025 | Li | .......................... | G01S 7/4816 |
| 2018/0322623 | A1 * | 11/2018 | Memo | ..................... | G06N 3/084 |

* cited by examiner

*Primary Examiner* — Gregory M Desire
(74) *Attorney, Agent, or Firm* — Winston Hsu

(57) ABSTRACT

A color depth integration method, a receiver, and a light detection and ranging apparatus thereof are disclosed to integrate image capturing with 3D depth measuring efficiently. A receiver includes at least one detector macro-cell, each of which includes a first detector configured to capture reflected light and a second detector configured to capture first external light. The first detector and the second detector are arranged in an array to constitute one detector macro-cell. The reflected light represents light emitted from a transmitter and reflected by at least one object. A frequency range of the first external light and a frequency range of the reflected light is non-overlapping or at least partially non-overlapping.

17 Claims, 10 Drawing Sheets

1

COLOR DEPTH INTEGRATION METHOD, RECEIVER, AND LIGHT DETECTION AND RANGING APPARATUS THEREOF

BACKGROUND OF THE INVENTION

1. Field of the Invention

The present invention relates generally to a color depth integration method, a receiver, and a light detection and ranging (LiDAR) apparatus thereof to fuse LiDAR with image sensing, and more particularly, to a color depth integration method, a receiver, and a LiDAR apparatus thereof for two-dimensional (2D) image capture and 3D depth measurement.

2. Description of the Prior Art

Autonomous mobile robots (e.g., robot vacuums) that draw increasing attention necessitate the ability of advanced environmental perception. Moreover, with the advent of Autonomous Driving Assist System (ADAS), automobiles demand sensor fusion between a 2D image and a 3D point cloud, which is capable of reliably detecting and identifying objects, hazards, and obstacles for long ranges. Consequently, there is a need for a new type receiver able to perform both 2D visible light imaging and 3D nonvisible depth measurement.

SUMMARY OF THE INVENTION

An embodiment of the present disclosure provides a receiver comprising at least one detector macro-cell, wherein each of the at least one detector macro-cell comprises a first detector, configured to capture reflected light, wherein the reflected light represents light emitted from a transmitter and reflected by an object; and a second detector, configured to capture first external light reflected by the object, wherein the first detector and the second detector are arranged in an array to constitute one detector macro-cell, and a frequency range of the first external light and a frequency range of the reflected light are non-overlapping or at least partially non-overlapping.

An embodiment of the present disclosure provides a light detection and ranging (LiDAR) apparatus, comprising a transmitter, comprising at least one light source to emit light; and a receiver, optically coupled to the transmitter and comprising at least one detector macro-cell, wherein each of the at least one detector macro-cell comprises a first detector, configured to capture reflected light, wherein the reflected light represents the light emitted from the transmitter and reflected by an object; and a second detector, configured to capture first external light reflected by the object, wherein the first detector and the second detector are arranged in an array to constitute one detector macro-cell, and a frequency range of the first external light and a frequency range of the reflected light are non-overlapping or at least partially non-overlapping.

An embodiment of the present disclosure provides a color depth integration method, comprising capturing reflected light using a first detector of a detector macro-cell, wherein the reflected light represents light emitted from a transmitter and reflected by an object; and capturing first external light reflected by the object using a second detector of the detector macro-cell, wherein the first detector and the second detector are arranged in an array to constitute the detector macro-cell, and a frequency range of the first external light and a frequency range of the reflected light are non-overlapping or at least partially non-overlapping.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
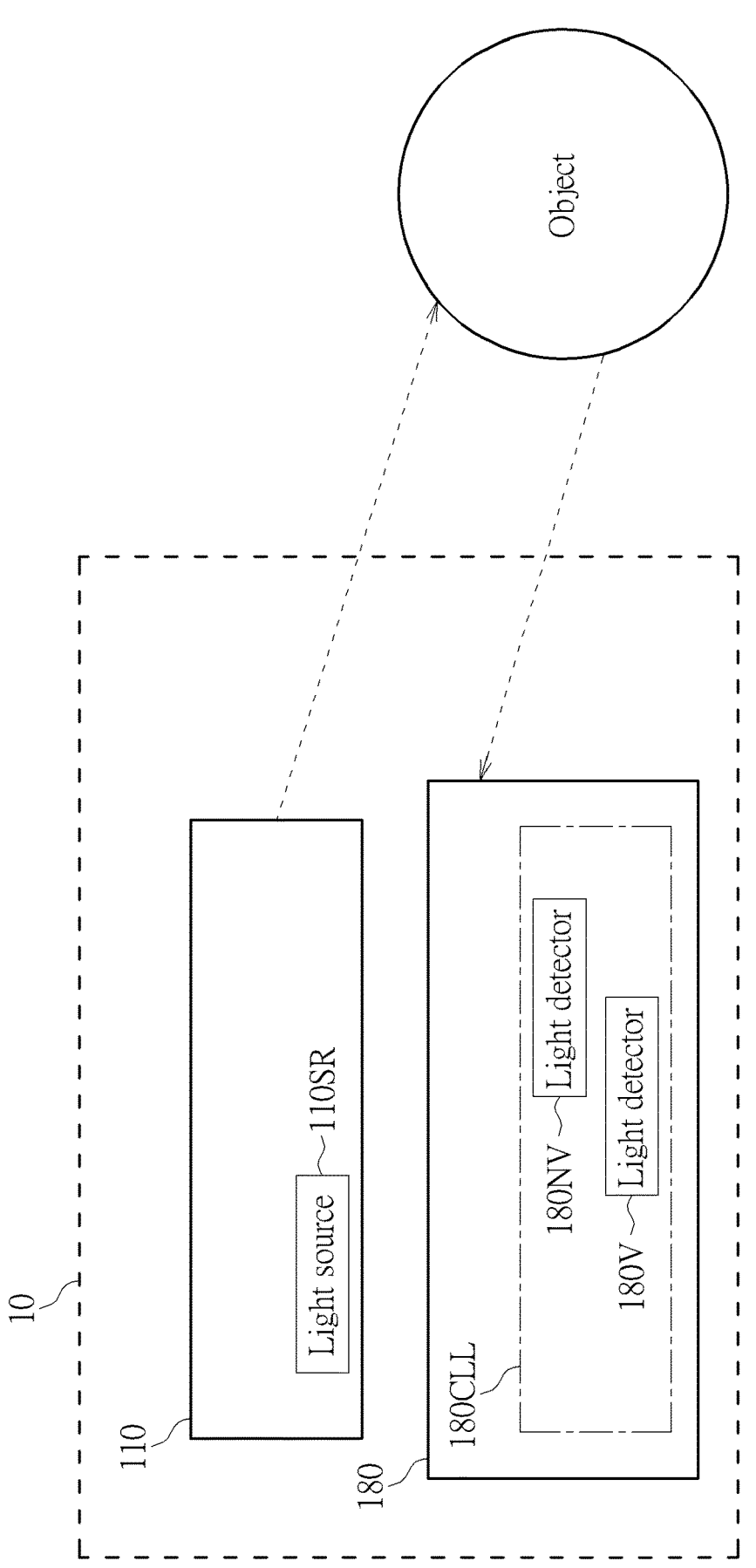
FIG. 1 is a schematic diagram of a LiDAR apparatus according to an embodiment of the present invention.

FIG. 1 is a schematic diagram of a LiDAR apparatus 10 according to an embodiment of the present invention. The LiDAR apparatus 10 may include a (light) transmitter 110, which is configured to emit light, and a (light) receiver 180, which is configured to capture the corresponding reflected light representing the light reflected by object(s). The transmitter 110 may include one or more (light) sources 110SR; the receiver 180 may include one or more (light) detector macro-cells 180CLL. Each detector macro-cell 180CLL, which serves or is regarded as one (sensor) pixel, may include (light) detectors 180NV and 180V.

The detector 180V may be physically implemented similarly to the detector 180NV; for example, the detector 180NV may be, for example but not limited thereto, a photo-detector, a photodiode, a photo-resistor, an avalanche photodiode (APD), a Geiger mode avalanche photodiode, a silicon based single photon avalanche diode (SPAD), a silicon photomultiplier (SiPM), a Germanium-on-silicon SPAD, or an InGaAs/InP SPAD, as the detector 180V. Both the detectors 180NV and 180V are disposed on a single substrate, formed monolithically, and fabricated by the same process/processes at once. However, the detector 180NV is configured to detect light within a frequency band/range that matches light emitted from the source 110SR, and the detector 180V is configured to detect light with frequencies different from the frequency band/range. In other words, only the detector 180NV responds to the source 110SR and measures the time difference between the light emitted from the source 110SR and the reflected light corresponding to the light.

For example, the detector 180NV is configured to detect nonvisible reflected light corresponding to the nonvisible light transmitted from the source 110SR, while the detector 180V is configured to detect visible light (e.g., ambient/external light originated from the sun or environment and reflected by object(s)). In an embodiment, the detector 180NV is masked with a nonvisible band-pass filter of its detector macro-cell 180CLL, while the detector 180V is masked with a color filter of its detector macro-cell 180CLL. In another embodiment, the detector 180NV is a nonvisible detector sensitive to nonvisible light, while the detector 180V is a visible detector sensitive to visible light, such that nonvisible band-pass filter(s) and color filter(s) are absent from its LiDAR apparatus.

Therefore, for each pixel (which corresponds to one detector macro-cell 180CLL), the detector macro-cell 180CLL can comprehensively determine the distance to (a point of) an object using the detector 180NV and determine the appearance/color of (the point of) the object using the detector 180V at once. The LiDAR apparatus 10 may thus provide a color image of object(s) and its corresponding 3D representation known as point cloud data, which is created by collecting distance-to-object-data and includes a (discrete) set of data points. Each data point of point cloud data thus has its set of Cartesian coordinates (x, y, z) with its color constructed through a combination of (intensity) values for, for example, red, green and blue light.

Figure 2:
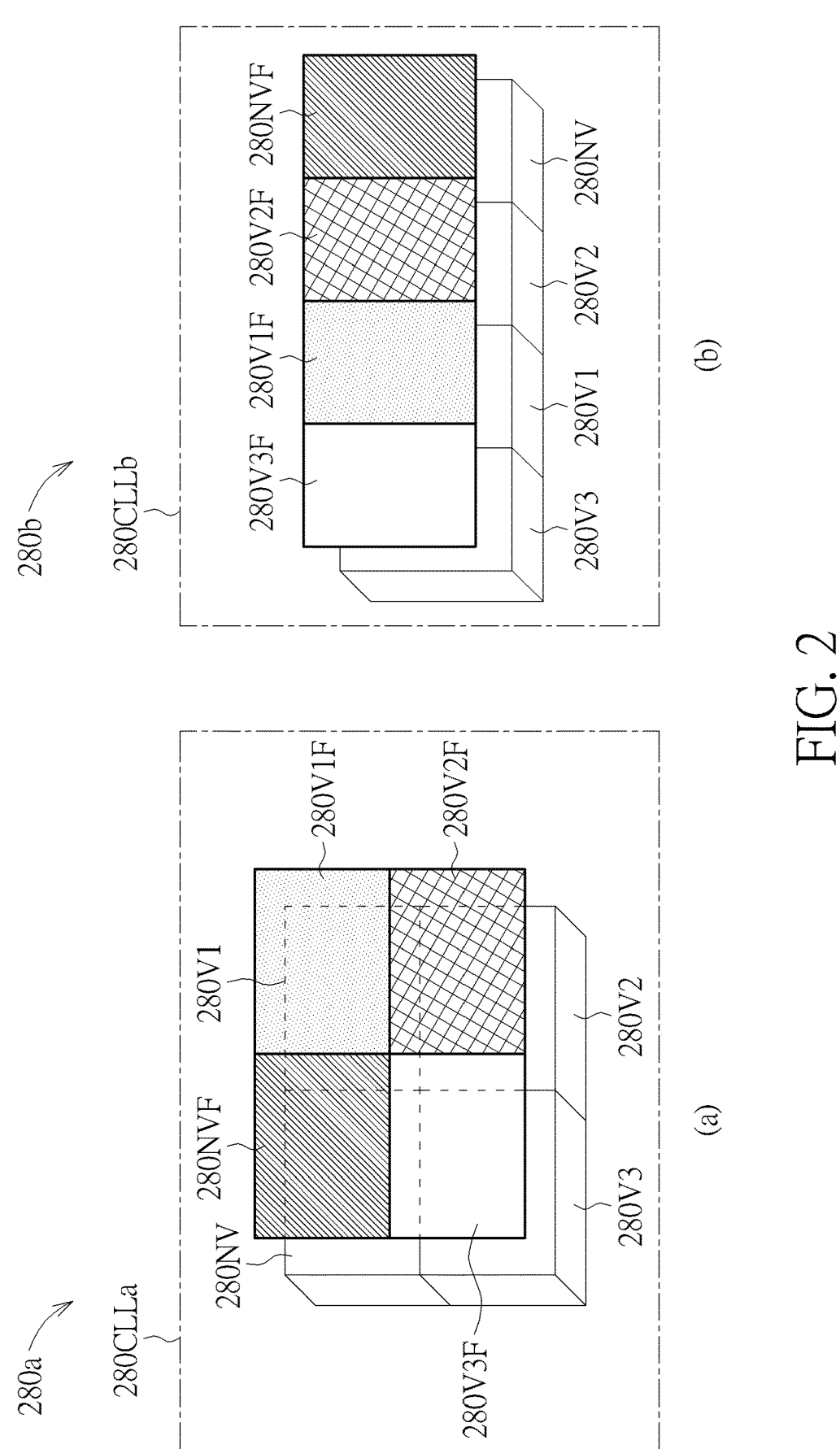
FIG. 2 to FIG. 4 are schematic diagrams of receivers according to embodiments of the present invention.

FIG. 2 is a schematic diagram of receivers 280*a* and 280*b* according to embodiments of the present invention. The receivers 280*a* and 280*b* may include detector macro-cells 280CLLa and 280CLLb, respectively. The detector macro-cell 280CLLa or 280CLLb may include detectors 280NV and 280V1-280V3. The detectors 280NV and 280V1-280V3 may be masked with filters 280NVF and 280V1F-280V3F of different frequency bands/ranges, such that the detectors 280NV and 280V1-280V3 may respond to, for example, infrared, green, red, and blue light, respectively. Alternatively, the detectors 280NV and 280V1-280V3 may respond to infrared, green, red, and yellow light, respectively. Alternatively, the detectors 280NV and 280V1-280V3 may respond to infrared, magenta, cyan, and yellow light, respectively. In an embodiment, the filters 280NVF, 280V1F-280V3F and another filter may be an infrared band-pass, a magenta color, a cyan color, a yellow color, and a black/key color filter, respectively.

The detectors 280NV and 280V1-280V3 may have different or identical size (e.g., 10×10 square micrometers) or shape. The arrangement of a detector macro-cell may vary according to different consideration: For example, one detector corresponding to the longest wavelength (e.g., the infrared band-pass or an infrared detector) may be disposed far from another detector corresponding to the second longest wavelength (e.g., the red color filter or a red detector) as shown in FIG. 2 (*a*). Alternatively, the arrangement of detectors of a detector macro-cell may be sequenced in the increasing/decreasing order of wavelength as shown in FIG. 2 (*b*).

Figure 3:
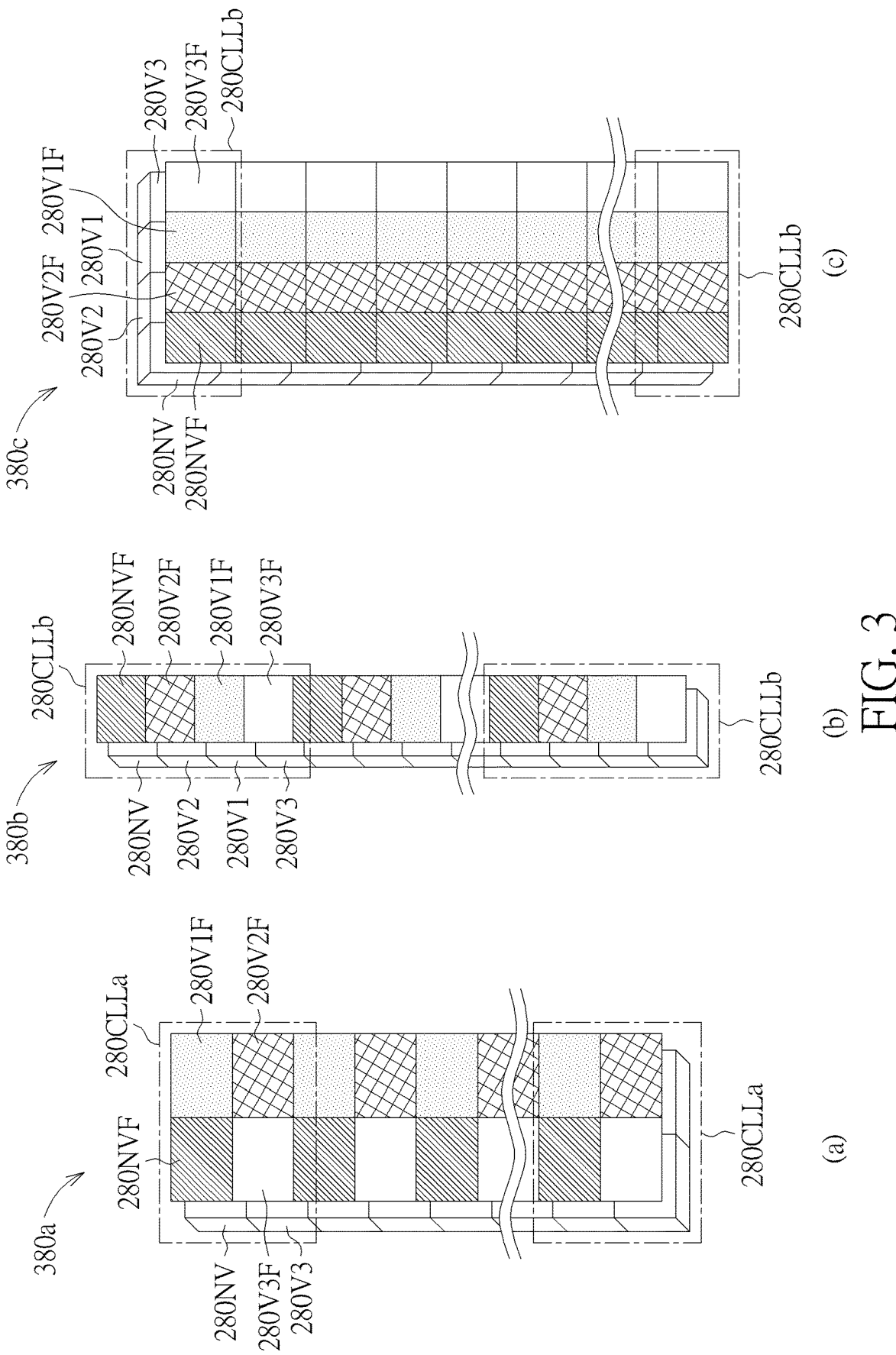
Figure 4:
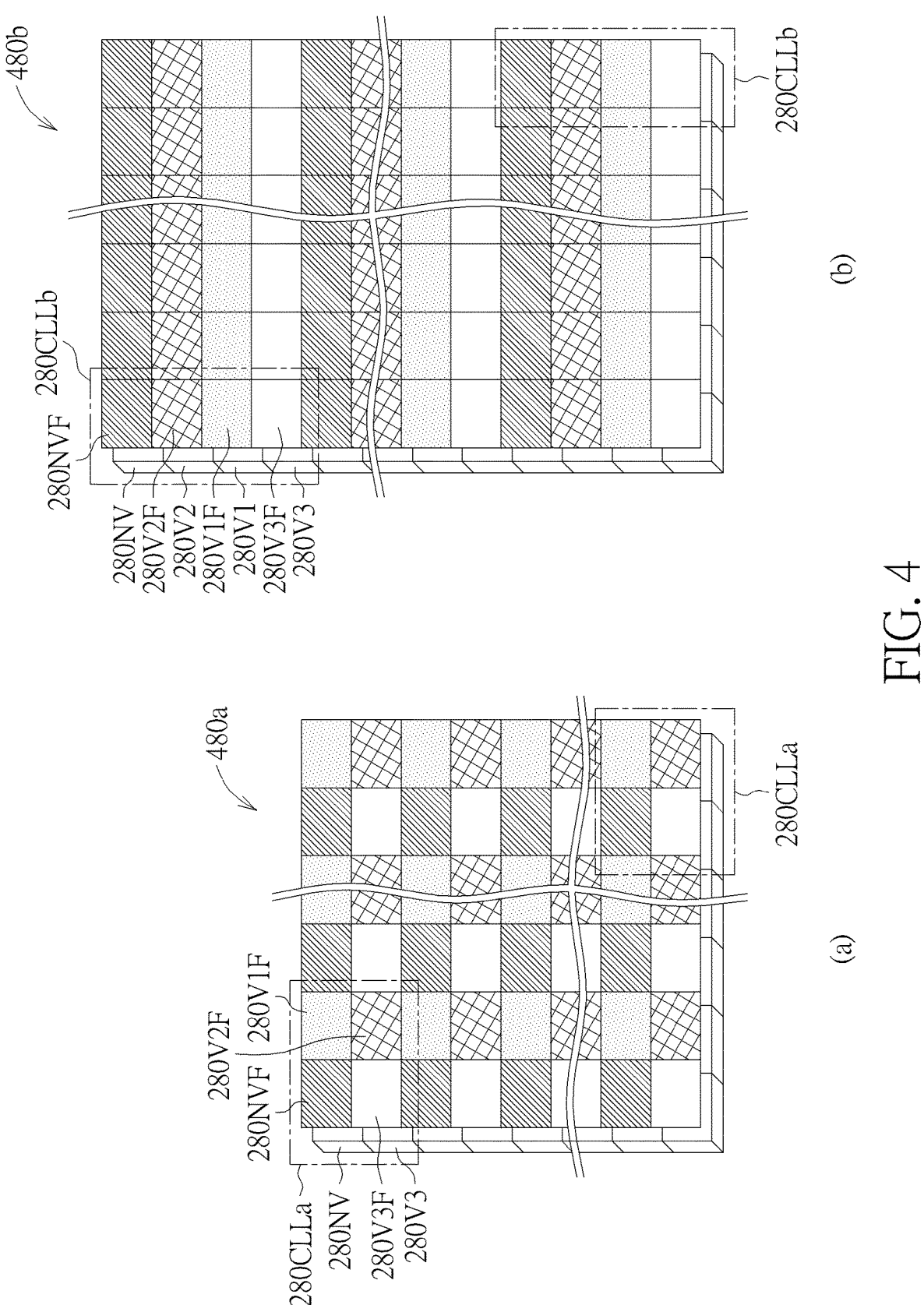

FIG. 3 is a schematic diagram of receivers 380*a*, 380*b*, and 380*c* according to embodiments of the present invention. FIG. 4 is a schematic diagram of receivers 480*a* and 480*b* according to embodiments of the present invention. Noted that detector macro-cells 280CLLa of the receiver 380*a* (or detector macro-cells 280CLLb of the receiver 380*b* or 380*c*) are arranged in a 1D array (such as a line, row, or column) for certain mode (e.g., a 1D line-scan mode), while detector macro-cells 280CLLa of the receiver 480*a* (or detector macro-cells 280CLL*b* of the receiver 480*b*) are arranged in a 2D array for certain mode (e.g., an area mode or a flash mode). The receiver 480*b* may be utilized in a 1D line-scan mode as well.

In an embodiment, the number of the detectors 280NV of all the detector macro-cells (or the total number of the detectors 280NV and 280V1-280V3 of all the detector macro-cells) may be equal/proportional to or a multiple of the number of all the source(s) 110SR of the transmitter 110 (e.g., in a single spot mode, in a flash mode, a 2D raster-scan mode, or a 1D line-scan mode). In another embodiment, the number of columns/rows of the detectors 280NV of all the detector macro-cells (or the total number of columns/rows of the detectors 280NV and 280V1-280V3 of all the detector macro-cells) may be equal/proportional to or a multiple of the number of all the source(s) 110SR of the transmitter 110 (e.g., in a 1D line-scan mode).

Figure 5:
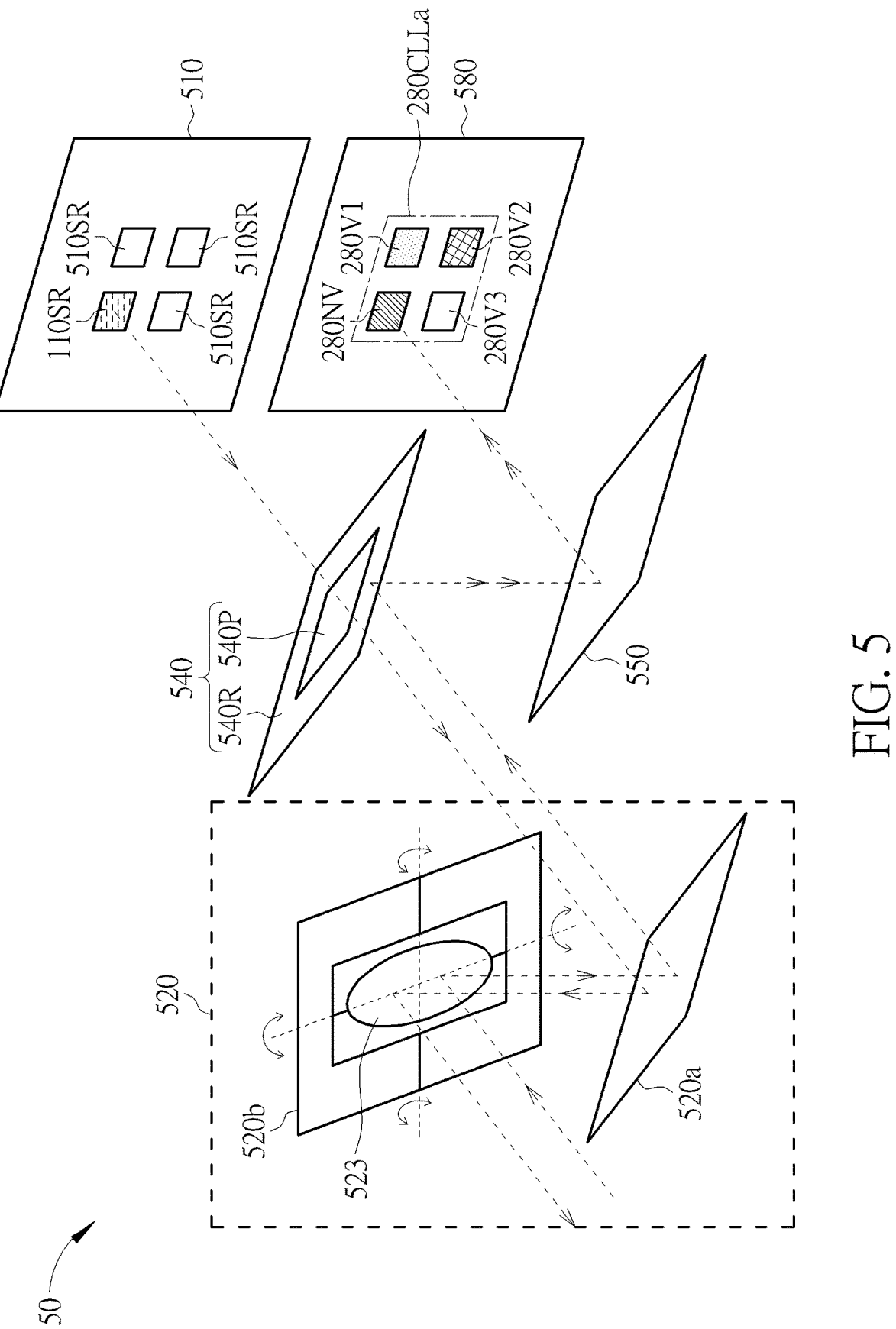
FIG. 5 to FIG. 10 are schematic diagrams of LiDAR apparatuses according to embodiments of the present invention.

FIG. 5 is a schematic diagram of a LiDAR apparatus 50 according to an embodiment of the present invention. The LiDAR apparatus 50 may include a transmitter 510, a beam steering unit 520, an optical separator 540, an optical deflector 550, and a receiver 580 optically coupled to each other.

In an embodiment, the transmitter 510 may include sources 110SR and 510SR. Each source 510SR may be implemented using one source 110SR; alternatively, a source 510SR may be identical to a source 110SR. Alternatively, the sources 110SR and 510SR are identical (nonvisible) light sources for transmitting (nonvisible) light. In an embodiment, the number (e.g., 0, 1, 2, or 3) of the sources 510SR is a multiple of the number (e.g., 1) of the source 110SR. For example, the total number (e.g., 4) of the sources 110SR and 510SR is equal to the total number (e.g., 4) of the detectors 280NV and 280V1-280V3. For example, corresponding to the receiver 580 including one detector macro-cell 280CLLa, the transmitter 510 may include only one source 110SR but may not include any source 510SR. In another embodiment, the detector macro-cell 280CLLa may be replaced by the detector macro-cell 280CLLb.

In this embodiment, the optical separator 540 may include a reflective surface 540R and have an opening 540P near the center of the reflective surface 540R, such that the light from the source 110SR may passes through the opening 540P without changing direction (but possibly with beam offset or spatial shift) while the corresponding reflected light from object(s) toward the detector 280NV and visible light (e.g., ambient/external light originated from the sun or environment and reflected by object(s)) may be redirected to the optical deflector 550 by the reflective surface 540R. The opening 540P may be an aperture/hole with a shape (e.g., a rectangle or circle) similar to that of the reflective surface 540R. In another embodiment, the optical separator 540 may be a beam-splitter or polarizing beam-splitter although its beam-splitting properties may not be ideal because the ratio of reflection to transmission may vary between wavelengths.

The beam steering unit 520 may include steering components 520*a* and 520*b*. A reflective surface 523 of the (adjustable) steering component 520*b*, the (stationary) steering component 520*a*, the reflective surface 540R, and the optical deflector 550 may have reflective coverings (e.g., mirrors) to manipulate light path through bending.

As shown in FIG. 5, the receiver 580 is disposed next to the transmitter 510 to make the LiDAR apparatus 50 coaxial. The light incident on the beam steering unit 520 and the reflected light deflected by the beam steering unit 520 are substantially parallel or coaxial; alternatively, the light deflected by the beam steering unit 520 and the reflected light incident on the beam steering unit 520 are substantially parallel or coaxial.

In this embodiment, the LiDAR apparatus 50 may leverage coaxial optical mechanism and scan the entire field of view (FOV) by moving/rotating the steering component 520*b* of the beam steering unit 520 in a single spot mode. In another embodiment, as described in U.S. application Ser. No. 17/900,864, the receiver 580 may include more detector macro-cells 280CLLa to collecting the reflected pulse light beams simultaneously as one flash LiDAR, and the transmitter 510 may include more sources (e.g., 110SR) to emit pulse light beams at once as one flash LiDAR.

Figure 6:
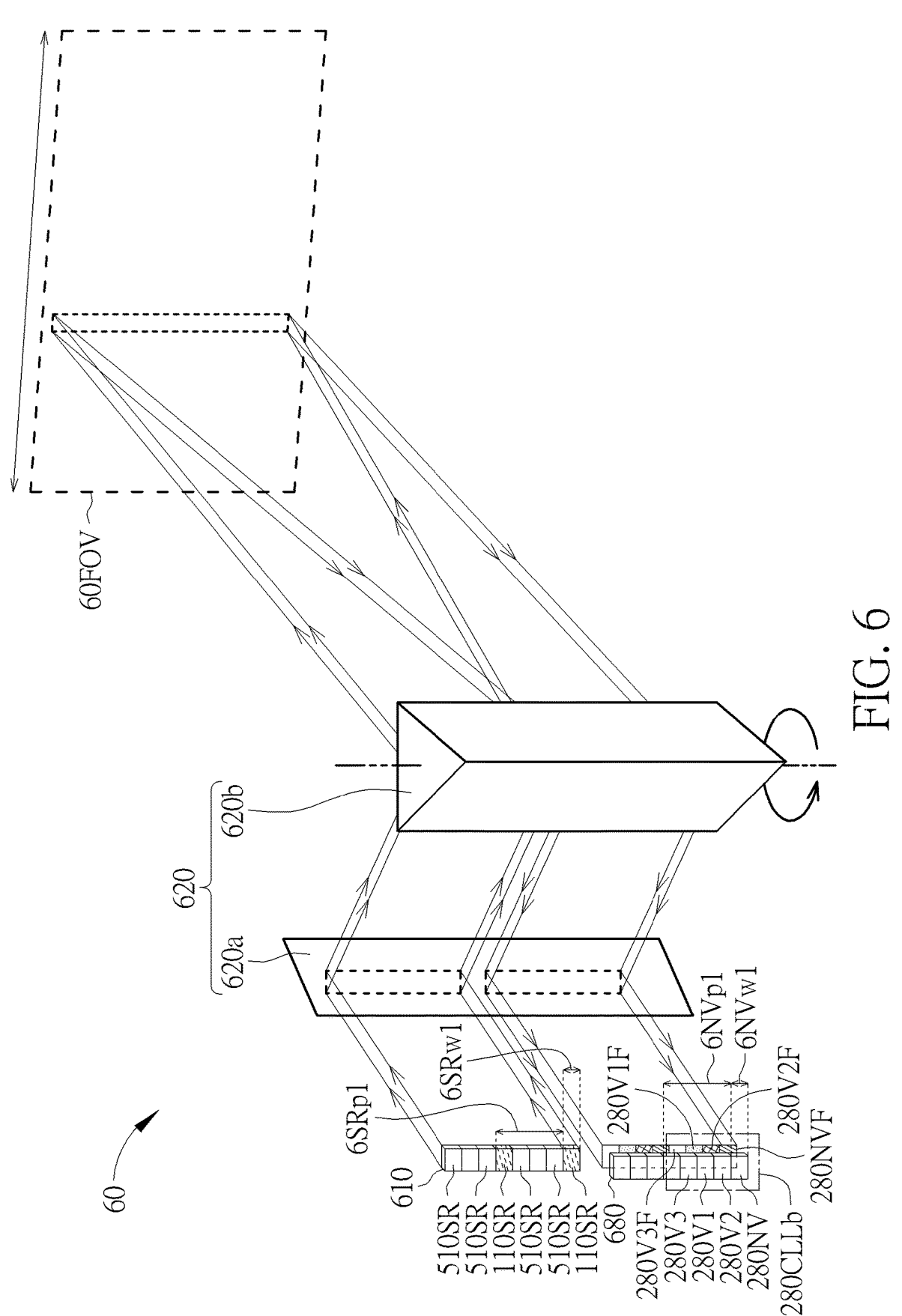

FIG. 6 is a schematic diagram of a LiDAR apparatus 60 according to an embodiment of the present invention. The LiDAR apparatus 60 may include a transmitter 610, a beam steering unit 620, and a receiver 680.

In an embodiment, the transmitter 610 may include sources 110SR and 510SR. In an embodiment, the number (e.g., 0, 2, 4, or 6) of the sources 510SR is a multiple of the number (e.g., 2) of the source 110SR. For example, the total number (e.g., 8) of the sources 110SR and 510SR is equal to the total number (e.g., 8) of the detectors 280NV and 280V1-280V3. For example, corresponding to the receiver 680 including two (or more) detectors macro-cell 280CLLb arranged in a 1D array, the transmitter 610 may include two (or more) sources 110SR lined up into a 1D array. In an embodiment, the ratio of a pitch 6NVp1 between one detector 280NV and another adjacent detector 280NV in a direction to a width 6NVw1 of one detector 280NV in the same direction is proportional to the ratio of a pitch 6SRp1 between one source 110SR and another adjacent source 110SR in that direction to a width 6SRw1 of one source 110SR in that direction. For example, the transmitter 610 may include two sources 110SR but may not include any source 510SR. In another embodiment, the receiver 680 may be replaced by the receiver 380c, which may include eight detector macro-cells 280CLLb, while the total number of the sources 110SR and 510SR equals eight.

The beam steering unit 620 may include a (stationary) steering component 620a and a (adjustable) steering component 620b, which may have reflective coverings (e.g., mirrors) to bend light. The LiDAR apparatus 60 may scan the entire FOV 60FOV by moving/rotating the steering component 620b in a 1D line-scan mode. The shape of the steering component 620b may be a prism or a polyhedron made of triangular bases, rectangular/square bases, or other polygon bases. For example, when the steering component 620b has two triangular bases as shown in FIG. 6, the FOV 60FOV may be $^{360}\!/_{3}=120$ degrees. For example, when the steering component 620b has two regular-pentagon bases or is a uniform pentagonal prism, the FOV may be $^{360}\!/_{5}=72$ degrees.

Figure 7:
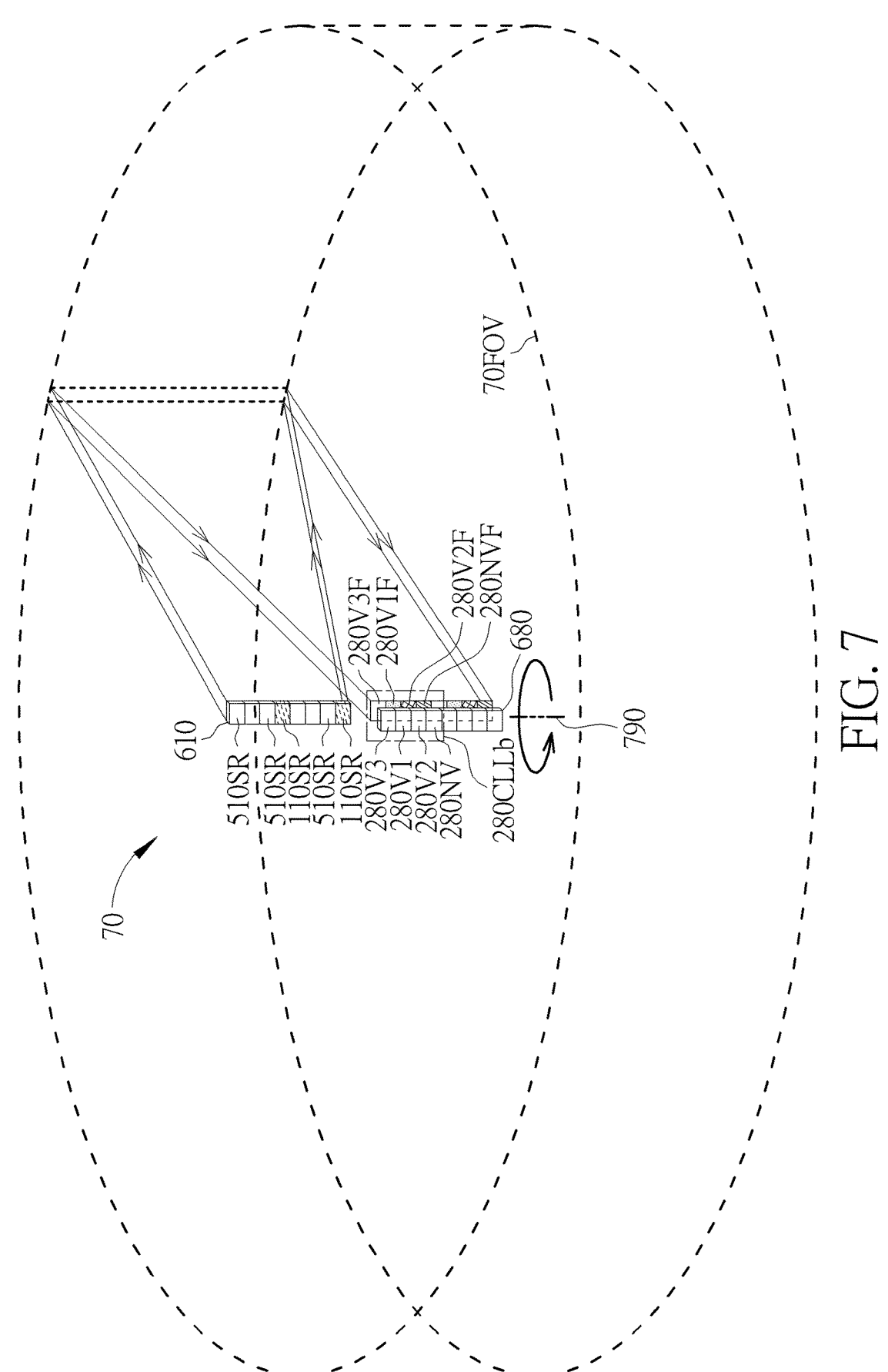

FIG. 7 is a schematic diagram of a LiDAR apparatus 70 according to an embodiment of the present invention. The LiDAR apparatus 70 may include the transmitter 610, the receiver 680, and a rotatable mover 790 (e.g., a motor). The rotatable mover 790 may facilitate the rotation of both the transmitter 610 and the receiver 680 to scan the entire FOV 70FOV (of 360 degrees) in a 1D line-scan mode.

Figure 8:
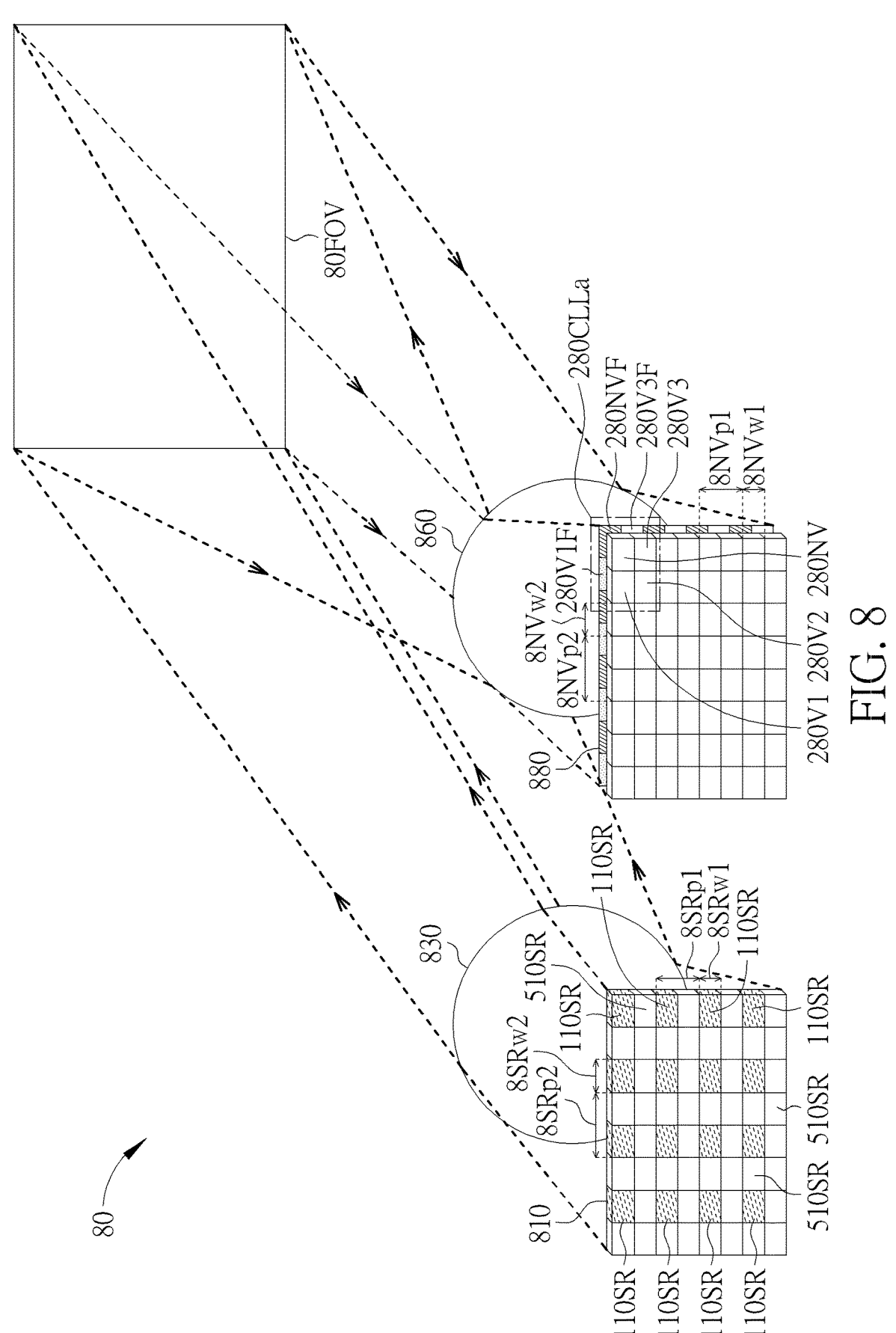

FIG. 8 is a schematic diagram of a LiDAR apparatus 80 according to an embodiment of the present invention. The LiDAR apparatus 80 may include a transmitter 810, optical curving units 830, 860, and a receiver 880. The optical curving unit 830 or 860 may be a lens. The transmitter 810 sends out (pulse) light, which illuminates the whole entire FOV 80FOV at once in a (non-coaxial) flash mode.

In an embodiment, the transmitter 810 may include sources 110SR and 510SR. The total number of the sources 110SR and 510SR is equal to the total number of the detectors 280NV and 280V1-280V3. In another embodiment, corresponding to the receiver 880 including 4×4 (or more) detector macro-cells 280CLLa arranged in a 2D array, the transmitter 810 may include 4×4 (or more) sources 110SR arranged in a 2D array. In an embodiment, the ratio of a pitch 8NVp1 (or 8NVp2) between one detector 280NV and another adjacent detector 280NV in a direction to a width 8NVw1 (or 8NVw2) of one detector 280NV in the same direction is proportional to the ratio of a pitch 8SRp1 (or 8SRp2) between one source 110SR and another adjacent source 110SR in that direction to a width 8SRw1 (or 8SRw2) of one source 110SR in that direction. In another embodiment, the transmitter 810 may include 4×4 sources 110SR but may not include any source 510SR.

Figure 9:
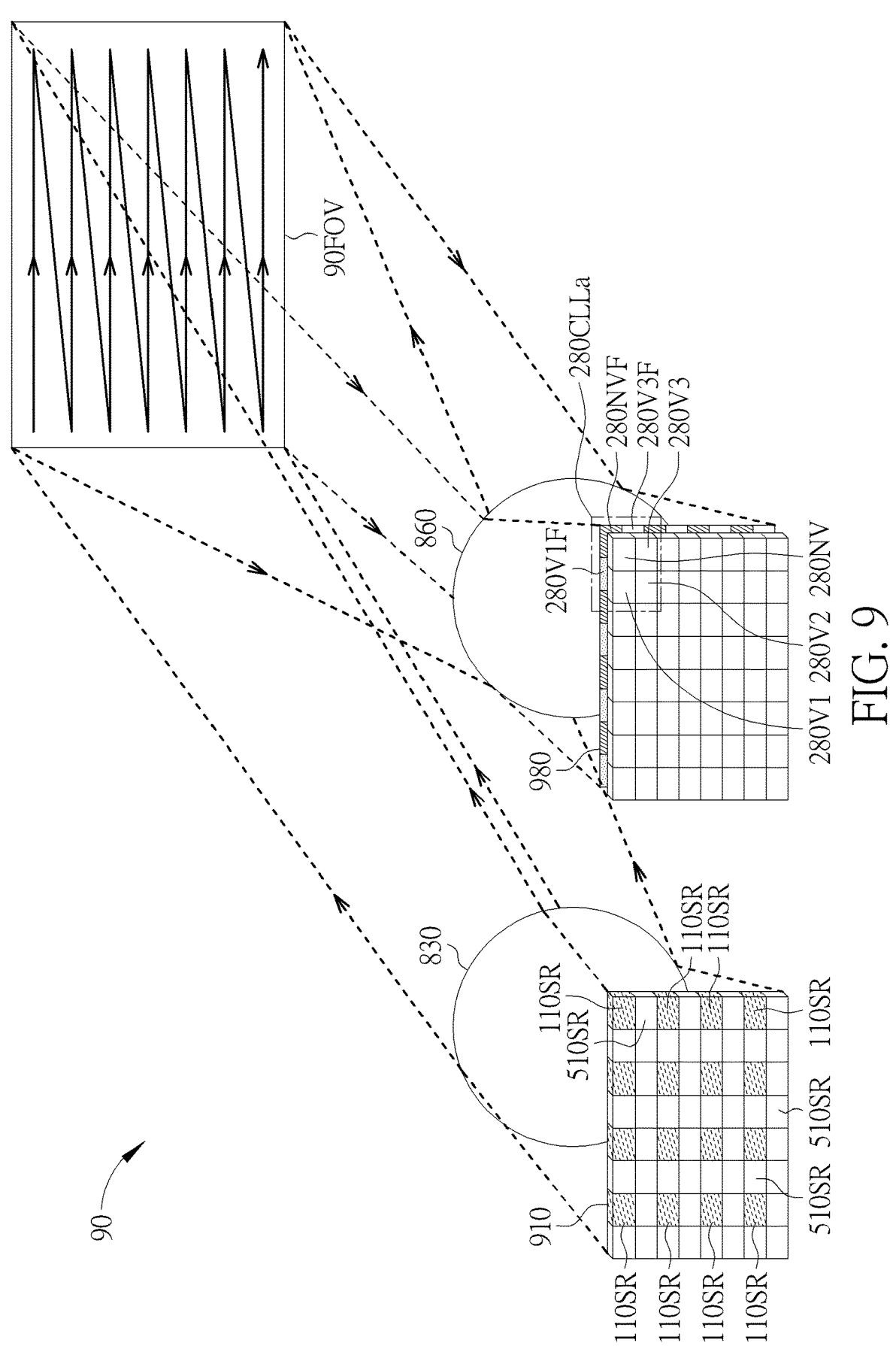

FIG. 9 is a schematic diagram of a LiDAR apparatus 90 according to an embodiment of the present invention. The LiDAR apparatus 90 may include a transmitter 910, the optical curving units 830, 860, and the receiver 980.

In an embodiment, the transmitter 810 may include sources 110SR and 510SR. The total number of the sources 110SR and 510SR is equal to the total number of the detectors 280NV and 280V1-280V3. Each source 110SR (or 510SR) is individual addressable or able to be individually activated to scan the entire FOV 90FOV (of 360 degrees) in a (non-coaxial) 2D scan mode. In an embodiment, only one individual source 110SR (or 510SR) is activated to fire up a light beam at a time. In an embodiment, only sources 110SR (and 510SR) in one column/row are activated to fire up a light beam at a time.

Figure 10:
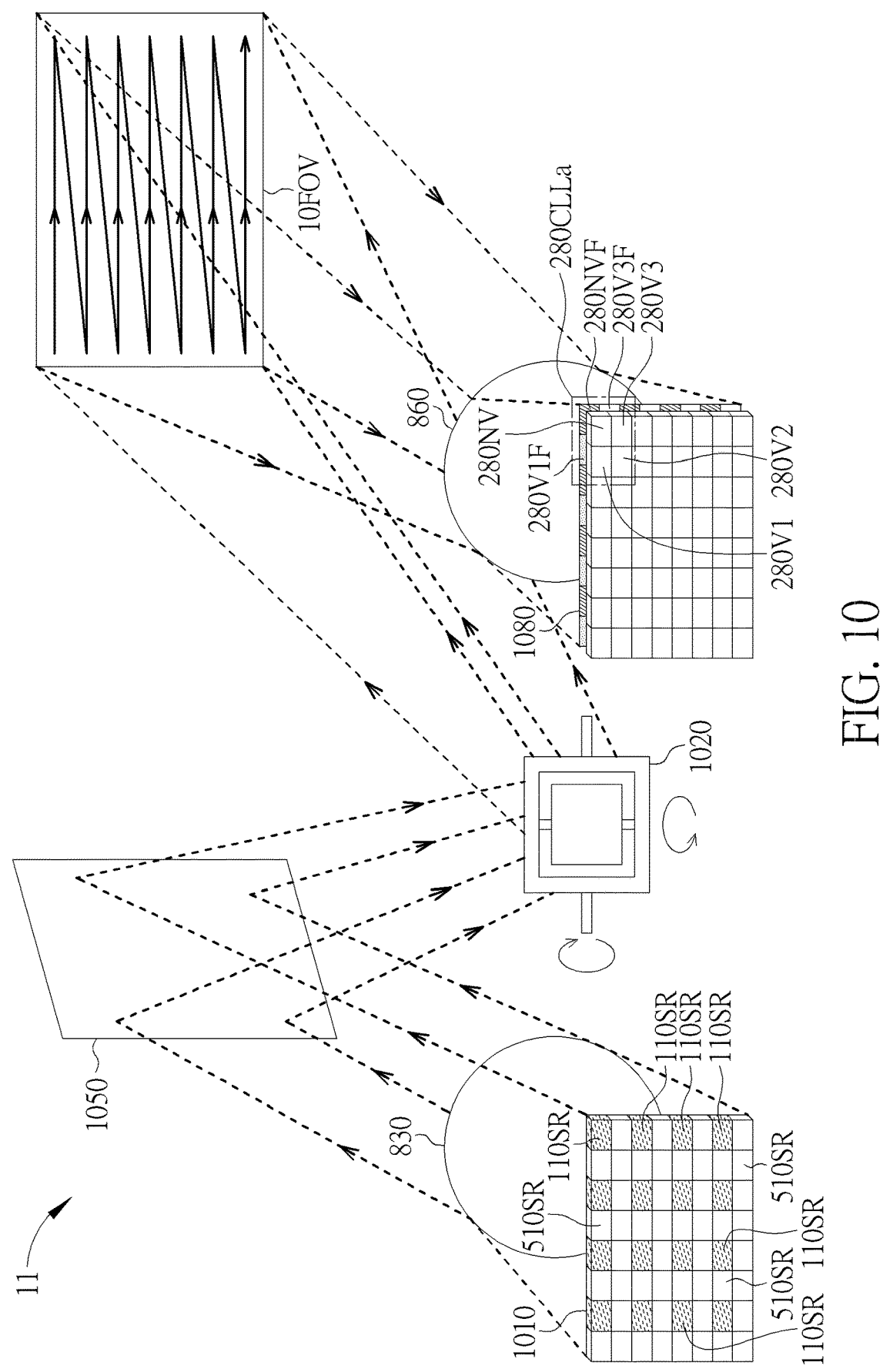

FIG. 10 is a schematic diagram of a LiDAR apparatus 11 according to an embodiment of the present invention. The LiDAR apparatus 11 may include a transmitter 1010, the optical curving units 830, 860, a beam steering unit 1020, an optical deflector 1050, and the receiver 1080.

The beam steering unit 1020 and the optical deflector 1050 may have reflective coverings (e.g., mirrors) to bend light. The beam steering unit 1020 may include a rotatable mirror or a microelectromechanical systems (MEMS) mirror. In this embodiment, the LiDAR apparatus 11 may scan the entire FOV 10FOV by moving/rotating the beam steering unit 1020 in a (non-coaxial) 2D scan mode. In another embodiment, as described in U.S. application Ser. No. 18/084,562, the (light) receiver may capture the reflected light from one FOV at a time to obtain high spatial resolution point cloud data as (beam) steering components of a beam steering unit are activated sequentially to multiplex the reflected light from different FOVs.

As shown in FIG. 5 to FIG. 10, for each pixel (which corresponds to one detector macro-cell 280CLLa or 280CLLb), the detector macro-cell 280CLLa or 280CLLb can comprehensively measure the distance to (a point of) an object using the detector 280NV and recognize the appearance/color (the point of) of the object using the detectors 280V1-280V2 at a time.

A color depth integration method, which may be compiled into a code and executed by a LiDAR apparatus (e.g., any of 10, 11, 50-90) or a device (e.g., a server, a central processing unit (CPU), or a graphics processing unit (GPU)) communicatively coupled to the LiDAR apparatus, may include the following steps:

Step S04: Instruct a transmitter (e.g., any of 110-1010) to emit (nonvisible) light. Go to Step S06.

Step S06: Instruct a first detector (e.g., 180NV or 280NV) of a detector macro-cell (e.g., 180CLL, 280CLLa, or 280CLLb) to capture reflected light representing the light emitted from the transmitter and instruct a second detector (e.g., 180V or 280V1) of the same detector macro-cell to capture external light within a first frequency band. In another embodiment, a third detector (e.g., 280V2) of the same detector macro-cell is instruct to capture external light within a second frequency band, and a fourth another detector (e.g., 280V3) of the same detector macro-cell is instruct to capture external light within a third frequency band. The (nonvisible) reflected light and the external light within the first frequency band, the second frequency band, and the third frequency band are obtained by the LiDAR apparatus concurrently. Go to Step S08.

Step S08: Associate/link a distance to a point in space (e.g., a point on an object) with color information of the point. The first detector is configured to exclusively respond to the light emitted from the transmitter to measure the distance to the point, and the second detector to the fourth detector are configured to respond to its surroundings except the light emitted from the transmitter to obtain the color information of the point. Therefore, each point is characterized by a unique set of Cartesian coordinates (x, y, z) and its color information presenting through a combination of the intensity of different visible light.

One or more of Steps S04 to S08 may be removed depending on different considerations.

Details or modifications of a beam steering unit, a steering component, an optical deflector, a (light) transmitter, a (light) source, a (light) receiver, or a (light) detector are disclosed in U.S. application Ser. Nos. 18/084,562 and 17/900,864, the disclosure of which is hereby incorporated by reference herein in its entirety and made a part of this specification.

The use of ordinal terms such as "first" and "second" does not by itself imply any priority, precedence, or order of one element over another, the chronological sequence in which acts of a method are performed, or the necessity for all the elements to be exist at the same time, but these terms are simply used as labels to distinguish one element having a certain name from another element having the same name. The technical features described in the following embodiments may be mixed or combined in various ways as long as there are no conflicts between them.

In an embodiment, a 2D image may be generated through the use of a complementary metal-oxide-semiconductor (CMOS) image sensor while a 3D point cloud sensor may be implemented by LiDAR. The 3D point cloud sensor emits nonvisible laser and calculate the time it takes for the laser to bounce back, thereby creating individual data points of a 3D point cloud. An array of SPADs may be used as a receiver of the 3D point cloud sensor for 3D depth sensing. A 2D image captured by a CMOS image sensor and a 3D point cloud obtained from a 3D point cloud sensor are outputted separately to external CPU/GPU(s), and the CPU/GPU(s) process/processes and fuse/fuses the 2D image and the 3D depth point cloud for object recognition. Such sensor fusion calls for long processing time and delays decision-making.

In another embodiment, a receiver (e.g., any of 180-1080) of a LiDAR apparatus (e.g., any of 10, 11, 50-90) may include detector macro-cell(s). Each detector macro-cell (e.g., 180CLL, 280CLLa, or 280CLLb) includes at least two SPADs: at least one for 2D imaging and the other for 3D depth measuring. All the SPADs of the LiDAR apparatus are arranged in an array and formed as a single entity. In this way, the receiver is able to employ certain SPAD(s) (e.g., 180NV or 280NV) to acquire a 3D point cloud while simultaneously utilizing the other SPAD(s) (e.g., 180V or 280V1-280V3) to capture a 2D image. A 2D image and a 3D point cloud obtained by the receiver at once are outputted together to external CPU/GPU(s), and thus the 2D image and the 3D point cloud are fused/combined before the CPU/GPU(s) process/processes the 2D image and the 3D depth point cloud for object recognition. This enhances processing efficiency while preventing delays in decision-making.

To sum up, for each pixel (which corresponds to one detector macro-cell), the detector macro-cell has the capacity to comprehensively measure the distance to (a point on) an object using one detector/SPAD and determine the appearance/color of (the same point on) the object using another detector/SPAD next to the former detector/SPAD at once. A LiDAR apparatus may thus efficiently obtain a color image of object(s) and its corresponding 3D representation known as point cloud data, which is derived by gathering distance-to-object-data, at once.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A receiver, comprising:
at least one detector macro-cell, wherein each of the at least one detector macro-cell comprises:
a first detector, configured to capture reflected light, wherein the reflected light represents light emitted from a transmitter and reflected by an object;
a second detector, configured to capture first external light reflected by the object;
a third detector, configured to capture second external light reflected by the object; and
a fourth detector, configured to capture third external light reflected by the object, wherein the first detector to the fourth detector are arranged in an array to constitute one detector macro-cell, the first external light to the third external light and the reflected light are obtained simultaneously, and a frequency range of the first external light and a frequency range of the reflected light are non-overlapping or at least partially non-overlapping, wherein
the first external light, the second external light, and the third external light are red, green, and blue respectively,
the first external light, the second external light, and the third external light are red, green, and yellow respectively, or
the first external light, the second external light, and the third external light are cyan, magenta, and yellow respectively.

2. The receiver of claim 1, wherein the first detector is configured to only respond to the transmitter to measure a distance to the object, and the second detector is configured to respond to its environment except the transmitter to obtain color information of the object.

3. The receiver of claim 1, wherein the first detector and the second detector are silicon based single photon avalanche diodes adjacent to each other or Geiger mode avalanche diodes adjacent to each other.

4. The receiver of claim 1, wherein the light and the reflected light are non-visible, and the first external light is visible.

5. The receiver of claim 1, wherein the first detector is masked with a non-visible band-pass filter to capture the reflected light, and the second detector is masked with a color filter to capture the first external light.

6. A light detection and ranging (LiDAR) apparatus, comprising:
a transmitter, comprising at least one light source to emit light; and
a receiver, optically coupled to the transmitter and comprising at least one detector macro-cell, wherein each of the at least one detector macro-cell comprises:
a first detector, configured to capture reflected light, wherein the reflected light represents the light emitted from the transmitter and reflected by an object;
a second detector, configured to capture first external light reflected by the object;

a third detector, configured to capture second external light reflected by the object; and a fourth detector, configured to capture third external light reflected by the object, wherein the first detector to the fourth detector are arranged in an array to constitute one detector macro-cell, the first external light to the third external light and the reflected light are obtained simultaneously, and a frequency range of the first external light and a frequency range of the reflected light are non-overlapping or at least partially non-overlapping, wherein the first external light, the second external light, and the third external light are red, green, and blue respectively, the first external light, the second external light, and the third external light are red, green, and yellow respectively, or the first external light, the second external light, and the third external light are cyan, magenta, and yellow respectively.

7. The LiDAR apparatus of claim 6, wherein the first detector is configured to only respond to the transmitter to measure a distance to the object, and the second detector is configured to respond to its environment except the transmitter to obtain color information of the object.

8. The LiDAR apparatus of claim 6, wherein the first detector and the second detector are silicon based single photon avalanche diodes adjacent to each other or Geiger mode avalanche diodes adjacent to each other.

9. The LiDAR apparatus of claim 6, wherein the light and the reflected light are non-visible, and the first external light is visible.

10. The LiDAR apparatus of claim 6, wherein the first detector is masked with a non-visible band-pass filter to capture the reflected light, and the second detector is masked with a color filter to capture the first external light.

11. The LiDAR apparatus of claim 6, wherein a ratio of a pitch between one first detector and another adjacent first detector in a first direction to a width of the first detector in the first direction is proportional to a ratio of a pitch between one light source and another adjacent light source in a second direction to a width of the light source in the second direction, and the first direction is parallel or nonparallel to the second direction.

12. The LiDAR apparatus of claim 6, wherein the LiDAR apparatus is a coaxial LiDAR apparatus or a non-coaxial LiDAR apparatus, and the transmitter is configured to scan or flash a two-dimensional field of view.

13. The LiDAR apparatus of claim 6, further comprising:

a beam steering unit, configured to steer the light or the reflected light, wherein the at least on first detector is arranged in a one-dimensional array or a two-dimensional array, and the at least one light source is arranged in a one-dimensional array or a two-dimensional array.

14. A color depth integration method, comprising:

capturing reflected light using a first detector of a detector macro-cell, wherein the reflected light represents light emitted from a transmitter and reflected by an object;

capturing first external light reflected by the object using a second detector of the detector macro-cell, wherein the first detector and the second detector are arranged in an array to constitute the detector macro-cell, and a frequency range of the first external light and a frequency range of the reflected light are non-overlapping or at least partially non-overlapping;

capturing second external light reflected by the object using a third detector of the detector macro-cell; and capturing third external light reflected by the object using a fourth detector of the detector macro-cell, wherein the first detector to the fourth detector are arranged in an array to constitute the detector macro-cell, the first external light to the third external light and the reflected light are obtained simultaneously, wherein the first external light, the second external light, and the third external light are red, green, and blue respectively, the first external light, the second external light, and the third external light are red, green, and yellow respectively, or the first external light, the second external light, and the third external light are cyan, magenta, and yellow respectively.

15. The color depth integration method of claim 14, further comprising:

associating a distance to a point in space with color information of the point, wherein the first detector is configured to only respond to the transmitter to measure the distance to the point, and the second detector is configured to respond to its environment except the transmitter to obtain the color information of the point.

16. The color depth integration method of claim 14, wherein the first detector and the second detector are silicon based single photon avalanche diodes adjacent to each other or Geiger mode avalanche diodes adjacent to each other.

17. The color depth integration method of claim 14, further comprising:

emitting the light using the transmitter, wherein the light and the reflected light are non-visible, and the first external light is visible.

* * * * *